United States Patent [19]
Colabella

[11] Patent Number: 6,057,192
[45] Date of Patent: May 2, 2000

[54] PROCESS FOR MAKING CROSSPOINT MEMORY DEVICES WITH CELLS HAVING A SOURCE CHANNEL WHICH IS AUTOALIGNED TO THE BIT LINE AND TO THE FIELD OXIDE

[75] Inventor: Elio Colabella, Milan, Italy

[73] Assignee: STMicroelectronics S.r.l., Milan, Italy

[21] Appl. No.: 09/130,834

[22] Filed: Aug. 7, 1998

[30] Foreign Application Priority Data

Aug. 8, 1997 [EP] European Pat. Off. .............. 97830418

[51] Int. Cl.⁷ .......................... H01L 27/00; H01L 21/336
[52] U.S. Cl. .......................... 438/264; 438/263; 438/257; 257/316
[58] Field of Search ................................. 438/252, 263, 438/264, 443; 257/316

[56] References Cited

U.S. PATENT DOCUMENTS

| | | | |
|---|---|---|---|
| 4,957,877 | 9/1990 | Tam et al. | 438/264 |
| 5,087,584 | 2/1992 | Wada et al. | 437/43 |
| 5,409,854 | 4/1995 | Bergemont | 438/264 |
| 5,726,470 | 3/1998 | Sato | 257/316 |
| 5,960,283 | 10/1997 | Sato | 438/257 |

*Primary Examiner*—Charles Bowers
*Assistant Examiner*—David S Blum
*Attorney, Agent, or Firm*—Theodore E. Galanthay; Robert Iannucci; Seed IP Law Group PLLC

[57] ABSTRACT

A process of manufacturing cross-point matrix memory devices which have floating gate memory cells having the source channel self-aligned to the bit line and the field oxide is disclosed. The process includes the steps of growing a thin layer of tunnel oxide on the matrix region; depositing a stack structure comprising a first conductive layer, an intermediate dielectric layer, and a second conductive layer; photolithographing with a Poly1 mask to define a plurality of parallel floating gate regions in the stack structure; self-aligned etching of the stack structure, above the active areas, to define continuous bit lines; and implanting, to confer predetermined conductivity on the active areas. Advantageously, the self-aligned cascade etching step for removing parallel strips from multiple layers, down to the active areas of the substrate, is discontinued before the field oxide is removed, and the implantation step is carried out in the presence of field oxide over the source active areas.

9 Claims, 4 Drawing Sheets

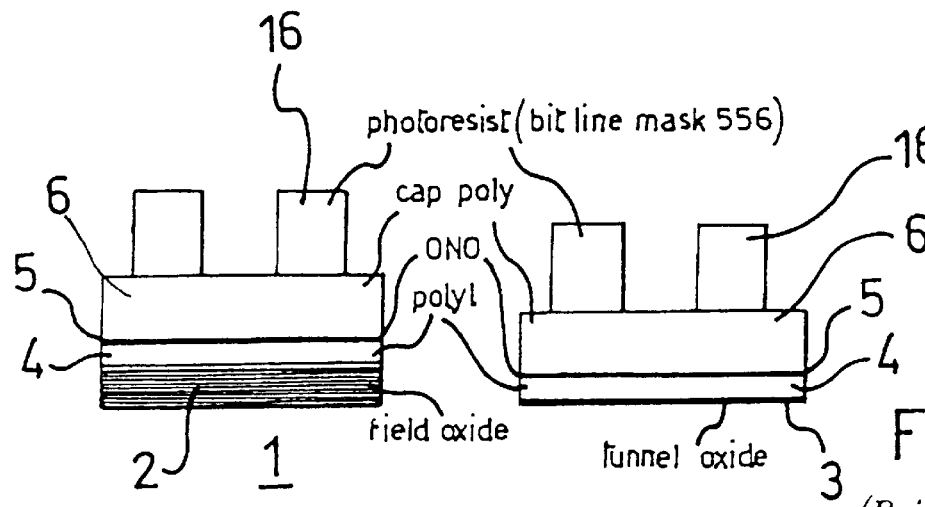
FIG. 1 (Prior Art)
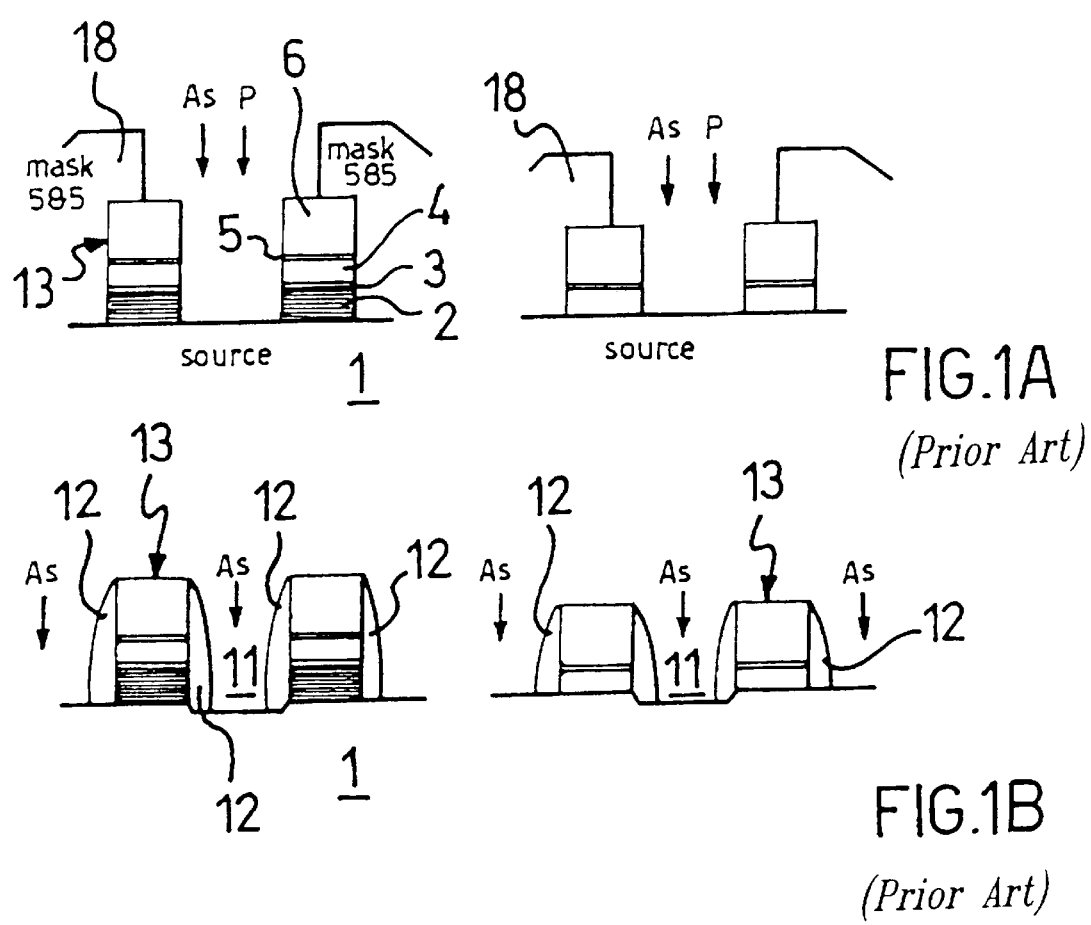
FIG. 1A (Prior Art)
FIG. 1B (Prior Art)

L > Leff

PROCESS FOR MAKING CROSSPOINT MEMORY DEVICES WITH CELLS HAVING A SOURCE CHANNEL WHICH IS AUTOALIGNED TO THE BIT LINE AND TO THE FIELD OXIDE

TECHNICAL FIELD

This invention relates to a process of manufacturing cross-point memory devices which have cells with the source channel self-aligned to the bit line and to the field oxide.

Specifically, the invention relates to a process of manufacturing cross-point matrix memory devices which have floating gate memory cells formed on a semiconductor substrate by a plurality of continuous bit lines laid across the substrate into discrete parallel strips, separated by active areas having the source channel self-aligned to the bit line and/or an isolation field oxide. The invention concerns in particular, but not exclusively, a process of manufacturing semiconductor integrated memories of the contact-less type which are provided with virtual ground circuitry, and reference will be made, throughout this specification, to that particular field of application for convenience of explanation.

BACKGROUND OF THE INVENTION

As is well known, electronic memory devices of the EPROM or FLASH-EPROM type require that a matrix type of layout be produced on a semiconductor substrate wherein a plurality of bit lines, formed of floating gate regions, are crossed over by a plurality of conductive strips, or word lines.

A known process of manufacturing memory devices of the EPROM or EEPROM type, more particularly EPROM, FLASH EPROM and EEPROM memory devices of the virtual ground, cross-point type, is described in European Patent No. 0 573 728, for example, incorporated herein by reference.

This prior document discloses an integrated device of the EPROM or FLASH EPROM type, wherein individual memory blocks include a matrix of cells comprising a plurality of word lines and a plurality of bit lines, lying orthogonally to each other. The multiple cross-points between the word lines and the bit lines define the memory cells.

A structure of this kind is known in the art as a "table-cloth" or cross-point matrix, and is peculiar in that the bit lines are formed in the semiconductor substrate by parallel, continuous diffused strips.

An advantageous aspect of this particular arrangement resides in the absence of metal contacts from the substrate area which is to accommodate the integrated memory cells; this feature greatly expands the capacity for integration on the semiconductor substrate.

Metal contacts are only formed at the opposite ends of the bit lines, and provide termination pads for each memory block.

For the present invention to be more readily understood, the conventional processing steps involved in defining, on a semiconductor substrate, the matrix layout of a virtual ground EPROM device having bit lines with floating gate regions will be recalled briefly herein below.

Starting with a semiconductor substrate 1, such as that shown in FIG. 1, which has been provided with a pattern of active areas and an optional layer 2 of field separation oxide, multiple depositions are performed over the entire substrate surface.

A thin layer 3 of tunnel oxide is deposited first. Thereafter, a first layer 4 of polysilicon, referred to as the Poly1, is deposited. This is followed by the deposition of a second dielectric layer 5 of the interpoly type, e.g., of ONO, which is then topped with a further deposition of a second layer 6 of polysilicon, the latter being also referred to as the poly cap.

At this stage, a photolithographic step using a mask 16, also referred as the Poly1 mask or 556 mask hereinafter, is carried out to define the layouts of the gate regions and their associated bit lines.

A self-aligned cascade etching step is carried out next to remove parallel strips from multiple layers, down to the active areas of the substrate 1.

This cascade etching operation will remove the poly cap layer 6, ONO layer 5, Poly1 layer 4, tunnel oxide layer 3, and field oxide 2 from the unprotected areas by the 556 mask.

As a result, a spatial geometry is defined on the semiconductor substrate 1 which includes a plurality of parallel lines, e.g., bit lines of memory cells and corresponding gate regions 13.

FIG. 2 is a schematic plan view of the pattern created by the etching step.

The gate regions 13 are formed of the stack or stacked structure of poly cap-ONO-Poly1-tunnel oxide and an optional field oxide, as shown in FIG. 1A.

After completion of the self-aligned etching, the 556 mask is removed and a second mask, referred to as the 585 mask, is formed to allow for a source implantation to be performed, as shown in FIG. 1A.

The 585 mask comprises long strips running parallel to the bit lines and fully covering drain lines 17, shown in FIG. 2, and in part the poly cap layer 6 as well.

Subsequent implantations are performed with phosphorus P and arsenic As in the active area regions which form the source lines 10, where they are needed to provide a gradual profile junction, specially adapted for erasing the memory cell.

The phosphorus implantation results in a well 9 being formed which accommodates a smaller well 8 in its interior, as shown in FIG. 2A.

P and As implants are also provided in the source regions or lines 10, where the field oxide 2 was present, shown in FIG. 2B. In these regions, the phosphorus and arsenic implantation wells are denoted by the numbers 7 and 14, respectively.

This is followed by a re-oxidation thermal treatment.

Subsequently, a dielectric layer, e.g., of TEOS, is deposited to evenly cover the whole structure. This dielectric layer is then etched back to define isolation spacers 12 which are laterally contiguous to each gate region 13.

This etching step is an anisotropic process conducted to simultaneously form the spacers 12 as well as openings 11 having a slight flare-out.

FIG. 1B shows the resultant structure, at the end of this TEOS back etching step and the start of an arsenic implantation step for both the source lines 10 and drain lines 17. This step is customarily referred to as the source and drain implantating step.

The processing steps described above are listed in sequential order herein below for convenience of illustration and of comparison to the inventive process to be described:

1) deposition of layers 3, 4, 5 and 6;
2) 556 masking (bit lines);
3) poly cap 6 etching;
4) ONO etching;
5) Poly1 etching;
6) field oxide etching (self-aligned source and drain etching;
7) removal of 556 mask;
8) 585 masking (source implantation);
9) P implant & As implant;
10) re-oxidation thermal treatment of cell;
11) TEOS deposition and etching;
12) source and drain (S&D) arsenic implantation.

Turning back to the process step of implanting phosphorus and arsenic, it will be appreciated that the phosphorus implant diffuses more than the arsenic implant because of the thermal treatment. Accordingly, the effective length Leff of the cell will be the distance separating the well 9, formed in implanting the phosphorus on the source line 10 side, from the well 8, formed in implanting the arsenic on the drain line 17 side.

FIG. 2 is a schematic top view, drawn to an enlarged scale, of the layout of a semiconductor portion as subjected to conventional processing steps.

Shown in that Figure is a section line a–a' which lies parallel to the word lines of the cell matrix, in the active area zones unoccupied by field oxide.

FIG. 2A is a schematic, vertical section view of the semiconductor, shown in FIG. 2, taken along said line a–a'.

FIG. 2B is a schematic, vertical section view of the semiconductor, shown in FIG. 2, taken along a second line b–b' and highlighting regions where the field oxide is present.

From a comparison of FIGS. 2A and 2B, it can be appreciated that in the zone of the bit line 13 underlying the field oxide 2, the distance Lpar between wells 7 and 14, as respectively formed by a phosphorus implant and an arsenic implant, is equal to Leff. The distance Lpar is a mere parasitic distance between the wells 7 and 14, and the distance Leff is the spacing of the drain and source implant wells, both under the field and under the active area.

Electrical data from analyses of memory cell performance show that as the length Leff decreases, the number of the devices that fail increases due to a leakage current 15 flowing beneath the bit line between the source line 10 and the drain line 17.

These leakage current paths may occur both under the active area zone of the bit line (region F in FIG. 2) and under the zone underlying the field of the bit line (region G in FIG. 2).

Such a problem obviously imposes a dimensional constraint whereby the width of the bit line, and with it the overall dimensions of the memory device, cannot be reduced.

SUMMARY OF THE INVENTION

An embodiment of this invention provides a process of manufacturing cross-point memory devices which include cells having a source channel self-aligned to the bit line and the field oxide. The process concurrently make leakage currents less likely to occur, even where the width of the bit lines is reduced. The process discontinues the an etching step with a Poly1 mask, upon the field oxide being reached, and performs the phosphorus and arsenic implantations while field oxide is still present over the source lines.

In one embodiment, the process includes the steps of growing a thin layer of tunnel oxide on the matrix region; depositing a stack structure comprising a first conductive layer, an intermediate dielectric layer, and a second conductive layer; photolithographing with a Poly1 mask to define a plurality of parallel floating gate regions in said stack structure; self-aligned etching of the stack structure, above the active areas, to define said continuous bit lines; and implanting, to confer predetermined conductivity on the active areas.

BRIEF DESCRIPTION OF THE DRAWINGS

The features and advantages of a process according to principles of the invention will be apparent from the following description of an embodiment thereof, given by way of non-limitative example with reference to the accompanying drawings.

FIG. 1 is an enlarged vertical section view showing a portion of a semiconductor as subjected to certain conventional process steps which result in the formation of bit lines in a memory matrix of the cross-point type.

FIGS. 1A and 1B are respective enlarged vertical section views showing the semiconductor portion of FIG. 1 as subjected to further conventional process steps.

DETAILED DESCRIPTION OF THE INVENTION

Figure 3:
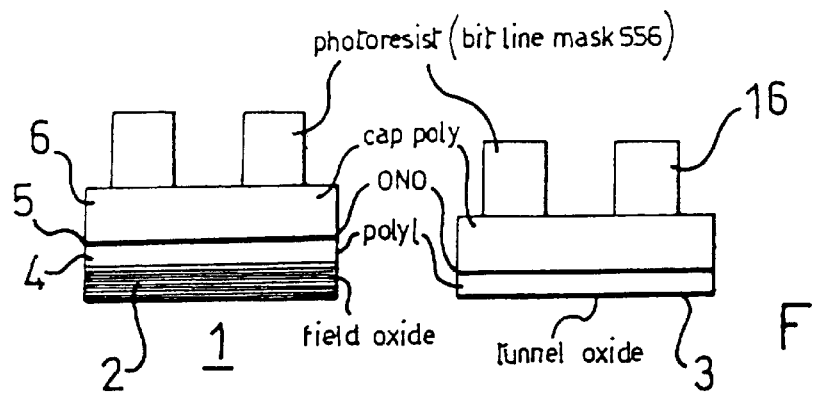
FIGS. 3, 3A and 3B correspond to FIGS. 1, 1A and 1B, but relate to the process of this invention.
Figure 4:
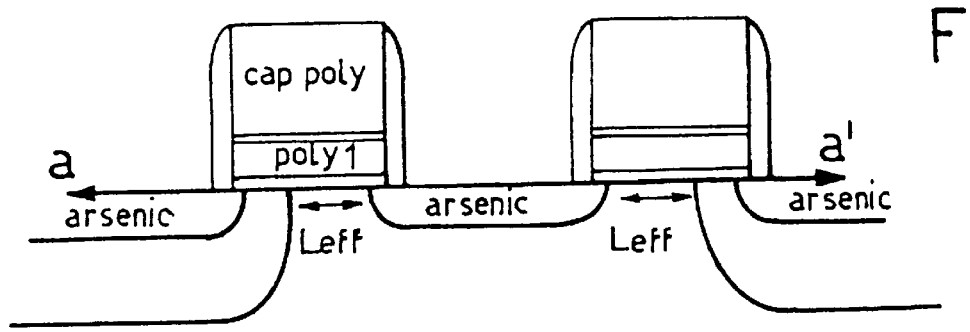
FIG. 4 is an enlarged vertical section view, taken along the line a–a' and showing schematically a portion of the semiconductor in FIG. 2 as subjected to the process steps of this invention.
Figure 5:
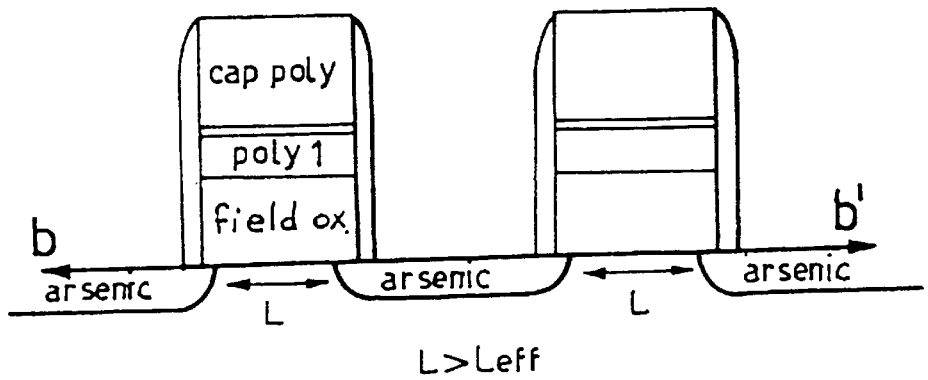
FIG. 5 is an enlarged vertical section view, taken along the line b–b' and showing schematically a portion of the semiconductor in FIG. 2 as subjected to the process steps of this invention.

Referring to the drawing views, in particular to the examples of FIGS. 3–5, the process of this invention goes at first through the same steps as are provided in conventional processes. This inventive process will be referred to as the SASFOX (Self-Aligned Source Field Oxide) process, for brevity hereinafter.

Specifically, the first five steps previously described in connection with the background of the invention are also carried out in the SASFOX process of this invention, and will be described no further herein.

FIG. 3 shows the semiconductor as delivered from the aforesaid five process steps, and corresponds essentially to FIG. 1.

At this stage, the SASFOX process according to this invention diverges from the conventional process in that the self-aligned cascade etching step, resulting in the removal of parallel strips from multiple layers down to the active areas of the substrate 1, is discontinued before the field oxide 2 is removed.

This cascade etching will remove, from the unprotected areas by the 556 mask, the poly cap layer 6, ONO layer 5, and layer 4 of Poly1.

The next steps of the SASFOX process consist, of removing the 556 mask, providing the 585 mask for the source implantation, implanting with phosphorus and arsenic, and removing the 585 mask, in this order.

Figure 3A:
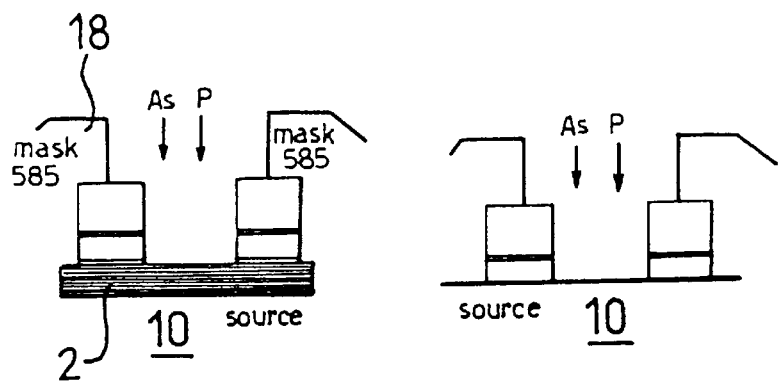
Figure 3B:
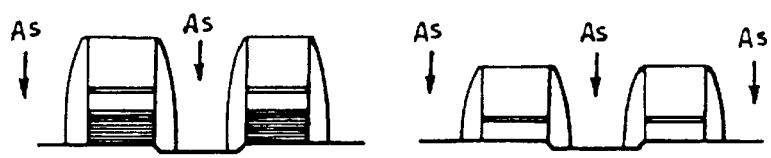

As best shown in FIG. 3A, for some portions of the memory device, the phosphorus and arsenic implanting step is carried out in the presence of field oxide 2 over the source lines 10.

It is only after completion of this etching step that the field oxide 2 will be removed.

The etching away of the field oxide 2 is carried out without the use of a mask.

A breakdown list of the successive steps in the SASFOX process according to this invention is given here below for convenience:

1a) deposition of layers 3, 4, 5 and 6;
2a) 556 masking;
3a) poly cap 6 etching;
4a) ONO etching;
5a) Poly1 etching;
6a) 556 mask removal;
7a) 585 masking (source implantation);
8a) P implant & As implant;
9a) 585 mask removal;
10a) field oxide etching (self-aligned source and drain etching);
11a) re-oxidation thermal treatment of cell;
12a) TEOS deposition and etching;
13a) source and drain arsenic implantation.

The SASFOX process being highly selective to the poly, the loss in thickness of the poly cap 6 during the field oxide etching can be limited to less than 300 Å, and would not affect the electric characteristics of the device.

Figure 2:
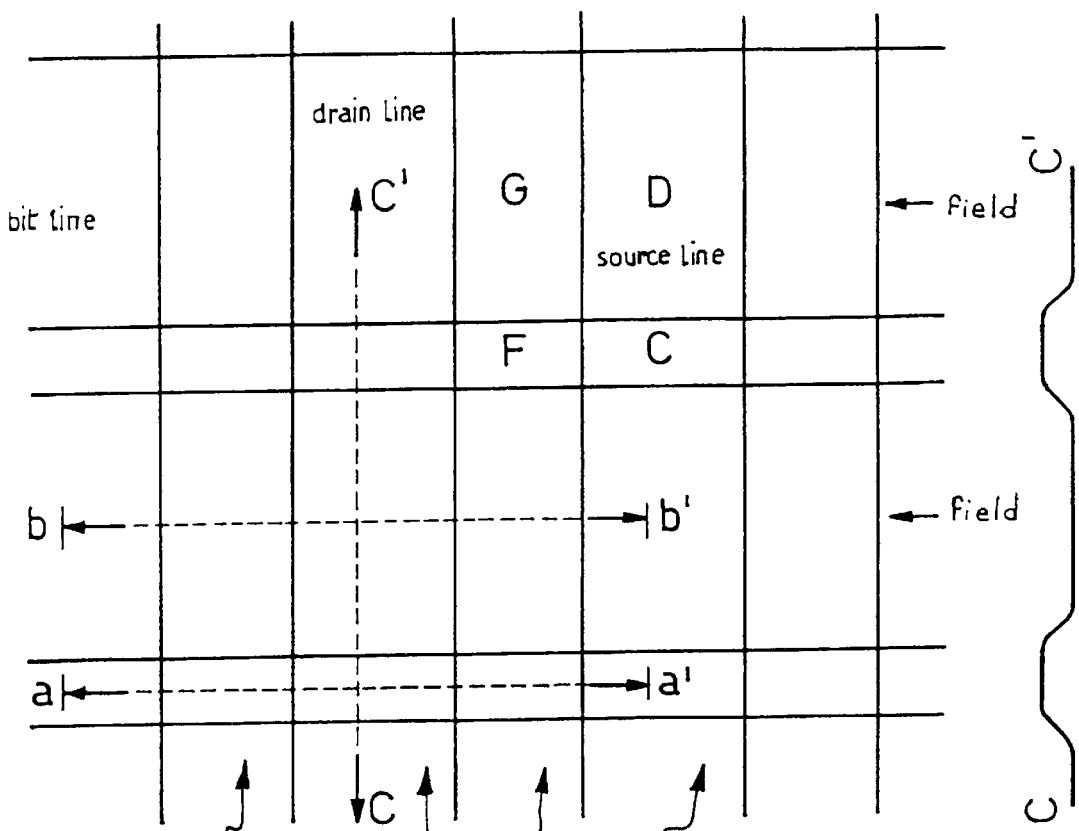
FIG. 2 is an enlarged top view showing schematically the layout of a semiconductor portion subjected to conventional process steps.
Figure 2A:
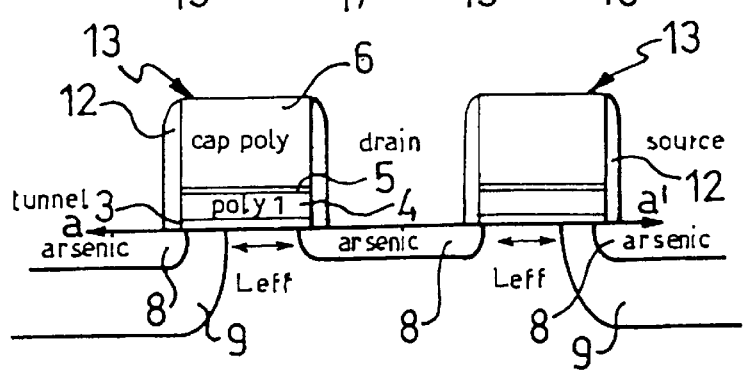
FIG. 2A is an enlarged vertical section view showing a portion of the semiconductor in FIG. 2 and taken along the line a–a'.
Figure 2B:
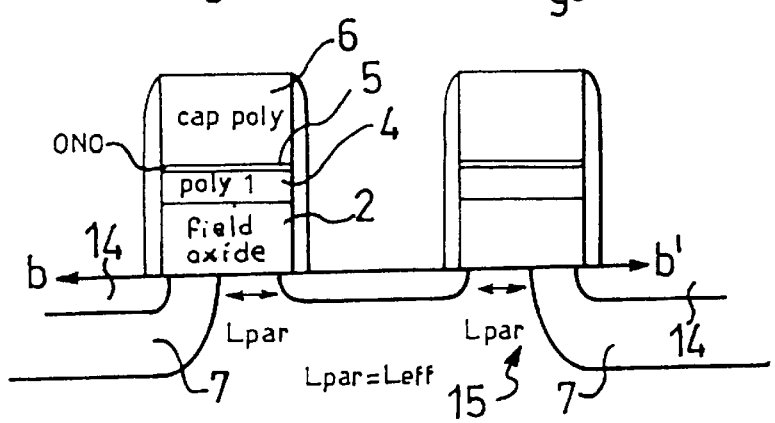
FIG. 2B is an enlarged vertical section view showing a portion of the semiconductor in FIG. 2 and taken along the line b–b'.

The etching of the field oxide 2 entails partial removal of the silicon from the active area, which also results in partial removal, from the source region at C in FIG. 2, of arsenic dopant not yet diffused.

This potential problem can be avoided by an increase of implantation energy, thereby sinking the arsenic to greater depth.

In the SASFOX process according to the invention, the implantation of phosphorus and arsenic using the 585 mask only affects the source active area regions (region C in FIG. 2), since the region D would still be covered with unetched field oxide 2.

The SASFOX process steps then continue in the same manner as previously described in connection with the background art, and on completion of the last source and drain arsenic implanting step, the profile of the doped areas of the bit lines will be that shown in FIGS. 4 and 5.

It can be appreciated from the Figures that the distance Lpar between implant wells in the region G of the bit line exceeds the effective length Leff, thereby making a leakage current in that area less likely to occur.

It should be noted that this result is obtained without changing the electrical dimensions of the cell.

In essence, the SASFOX process of this invention can lower the likelihood of current leaking into the bit line region (G) over the field oxide, by providing for an increased length Lpar while leaving the length Leff unchanged.

The application of a SASFOX process according to the invention brought out by the structure of the end product, and can be recognized by a SEM analysis of the dopant profiles at the cross-sections a–a' and b–b'.

Alternatively, a similar result could be obtained by using the standard SASFOX process flow and modifying the source implantation 585 mask.

As previously mentioned, the 585 mask forms long strips of photoresist running parallel to the bit line to fully cover the drain line, and in part the bit line as well. It could be thought of modifying this mask to a checkerboard pattern apertured at the locations of the source active areas. The implantation of phosphorus and arsenic would then be carried out at the same stage of the process as described above.

By suitable modification, the SASFOX process flow of this invention can be applied to any memory cells having a SAS (Self-Aligned Source) type of architecture.

In particular, the invention may be applied to the fabrication of conventional cell matrices, that is matrices other than the cross-point type.

The technical problem solved by this invention more deeply affects, however, cross-point matrices, because a reduction in their dimensions is apt to make a failure of the device far more likely.

The same problem also affects other memory matrix types, but to a lesser extent because of the smaller number of potential leakage paths therein. In such matrices, in fact, the drain region of a cell is isolated from the drain region of an adjacent cell by a region of field oxide.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A process of manufacturing cross-point matrix memory devices which have floating gate memory cells formed on a semiconductor substrate by a plurality of continuous bit lines laid across the substrate into discrete parallel strips, separated by active areas having a source channel self-aligned to one of the bit lines and/or an isolation field oxide, the process comprising the steps of:

growing a thin layer of tunnel oxide a the matrix region;

depositing a stack structure that includes a first conductive layer, an intermediate dielectric layer, and a second conductive layer;

photolithographing with a Poly 1 mask to define a plurality of parallel floating gate regions in said stack structure;

self-aligned cascade etching of said stack structure, above the active areas, to define said continuous bit lines;

implanting, to confer predetermined conductivity on the active areas;

wherein said implantation step is carried out in the presence of field oxide over the source active areas and the self-aligned cascade etching step removes parallel strips from multiple layers, down to the active areas of the substrate, and is discontinued before the field oxide is removed.

2. The process according to claim 1 wherein said mask of is removed after said etching step.

3. The process according to claim 1 wherein the field oxide is removed after said implantation step.

4. The process according to claim 1 wherein the etching of the field oxide is performed without a mask.

5. A method of making a cross-point memory cell matrix having floating gate memory cells including active areas, the method comprising:

forming a field oxide on a substrate;
forming a first polysilicon layer on the field oxide;
forming a dielectric layer on the first polysilicon layer;
forming a second polysilicon layer on the dielectric layer;
defining a plurality of parallel regions of the first polysilicon, dielectric, and second polysilicon layers;
self-aligned etching of the first polysilicon, dielectric, and second polysilicon layers exclusive of the parallel regions; and
implanting a dopant through the field oxide into the substrate within one of the active areas.

6. The method of claim 5, further including forming a tunnel-oxide over the substrate.

7. The method of claim 5 wherein defining a plurality of parallel regions comprises forming a mask covering the first polysilicon layer.

8. The method of claim 5, further including removing the field oxide following the implantation of a dopant.

9. The method of claim 8, further including forming a mask prior to removing the field oxide.

* * * * *